United States Patent
Ko

(10) Patent No.: US 8,503,256 B2
(45) Date of Patent: Aug. 6, 2013

(54) COLUMN COMMAND BUFFER AND LATENCY CIRCUIT INCLUDING THE SAME

(75) Inventor: Jae Bum Ko, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 490 days.

(21) Appl. No.: 12/841,095

(22) Filed: Jul. 21, 2010

(65) Prior Publication Data

US 2011/0242911 A1    Oct. 6, 2011

(30) Foreign Application Priority Data

Mar. 31, 2010 (KR) .................. 10-2010-0029070

(51) Int. Cl.
*G11C 7/00* (2006.01)
(52) U.S. Cl.
USPC .......... 365/194; 365/233.11; 365/233.12; 327/156
(58) Field of Classification Search
USPC .......... 365/193, 194, 191, 189.12, 233.1, 365/233.11, 233.12, 239, 240; 327/156, 157, 327/158, 159

See application file for complete search history.

(56) References Cited

U.S. PATENT DOCUMENTS

| | | | |
|---|---|---|---|
| 6,317,381 B1 | 11/2001 | Gans et al. | |
| 6,564,287 B1 | 5/2003 | Lee | |
| 6,636,446 B2 | 10/2003 | Lee et al. | |
| 7,055,012 B2 | 5/2006 | LaBerge et al. | |
| 2005/0105363 A1 | 5/2005 | Ko | |
| 2005/0201183 A1 | 9/2005 | Ho | |

FOREIGN PATENT DOCUMENTS

| | | |
|---|---|---|
| KR | 1020060059299 A | 6/2006 |
| KR | 10-2010-0076737 | 7/2010 |

*Primary Examiner* — Richard Elms
*Assistant Examiner* — Hien Nguyen
(74) *Attorney, Agent, or Firm* — William Park & Associates Patent Ltd.

(57) ABSTRACT

A column command buffer includes a variable delay section configured to determine a delay time based on a frequency of a clock, and output a column command after delaying it by the delay time; and a buffering section configured to receive an output of the variable delay section and generate internal column commands.

17 Claims, 6 Drawing Sheets

COLUMN COMMAND BUFFER AND LATENCY CIRCUIT INCLUDING THE SAME

CROSS-REFERENCES TO RELATED APPLICATION

The present application claims priority under 35 U.S.C. §119(a) to Korean Application No. 10-2010-0029070, filed on Mar. 31, 2010, in the Korean Intellectual Property Office, which is incorporated herein by reference in its entirety as if set forth in full.

BACKGROUND

1. Technical Field

The present invention relates to a semiconductor memory apparatus, and more particularly, to a column command buffer of a semiconductor memory apparatus and a latency circuit including the same.

2. Related Art

A semiconductor memory apparatus performs a read operation and a write operation in response to a read command and a write command which are inputted from outside through a pad. Since the read operation and the write operation are related to column operations of the semiconductor memory apparatus, the read command and the write command are also called column commands. The column commands are converted into internal column commands through column command buffers. Currently, in a semiconductor memory apparatus, specifically, a DRAM (dynamic random access memory), a CAS latency is defined and used. The CAS latency means a time from when a read command is inputted till the data of the semiconductor memory apparatus is outputted. When the read command is inputted, the semiconductor memory apparatus generates an internal read signal by delaying an internal column command generated from the read command by a clock cycle corresponding to the CAS latency. The semiconductor memory apparatus performs a read operation in response to the internal read signal.

In a semiconductor memory apparatus developed since the advent of DDR2, an additive latency has been proposed to be used. The additive latency means a time, when a semiconductor memory apparatus is activated, from when a read or write command is inputted to a tRCD (RAS to CAS Delay). The tRCD defines a time from when a row address signal is inputted till a column address signal is inputted. In a semiconductor memory apparatus developed before DDR2, a read or write command can be inputted only after the tRCD. However, in a semiconductor memory apparatus since DDR2, because a read or write command can be inputted more quickly by the additive latency, the responding speed of the semiconductor memory apparatus can be increased. The additive latency can be set in an EMRS (extended mode register set). For example, the additive latency can be set as AL=0, AL=CL-1 or AL=CL-2.

Accordingly, when a column command is inputted, the semiconductor memory apparatus performs the read operation by delaying the column command by a clock cycle corresponding to the additive latency and the CAS latency.

FIG. 1 is a block diagram schematically illustrating a configuration of a conventional latency circuit. Referring to FIG. 1, a conventional latency circuit includes a column command buffer unit 10, an additive latency shifting unit 20, and a CAS write latency shifting unit 30. The column command buffer unit 10 receives a column command CASP6 and generates first and second internal column commands CASP8_NON_AL0 and CASP8_AL0. When an additive latency is 0, the column command buffer unit 10 generates the second internal column command CASP8_AL0 in response to a control signal AL0 inputted from a mode register set. The column command buffer unit 10 does not generate the second internal column command CASP8_AL0 when the additive latency is CL-1 or CL-2.

The additive latency shifting unit 20 receives the first and second internal column commands CASP8_NON_AL0 and CASP8_AL0 and control signals ALCL_1 and ALCL_2 and generates an internal read signal RD_int. The additive latency shifting unit 20 may include a plurality of flip-flops (not shown) and a plurality of pass gates (not shown). The additive latency shifting unit 20 outputs the second internal column command CASP8_AL0 as the internal read signal RD_int when the second internal column command CASP8_AL0 is inputted. When the first internal column command CASP8_NON_AL0 is inputted, the additive latency shifting unit 20 generates the internal read signal RD_int by delaying the first internal column command CASP8_NON_AL0 by a clock cycle corresponding to a CAS latency CL<5:11> and the additive latency through the plurality of flip-flops and the plurality of pass gates. The semiconductor memory apparatus performs a read operation in response to the internal read signal RD_int.

The CAS write latency shifting unit 30 generates an internal write signal WT_int by delaying the internal read signal RD_int according to a CAS write latency CWL<5:8>. Similar to the additive latency shifting unit 20, the CAS write latency shifting unit 30 may include a plurality of flip-flops (not shown) and a plurality of pass gates (not shown), and can delay the internal read signal RD_int by a clock cycle corresponding to the CAS write latency CWL<5:8>.

FIG. 2 is a circuit diagram illustrating a configuration of the column command buffer unit shown in FIG. 1. The column command buffer unit 10 receives the column command CASP6 and generates the first and second internal column commands CASP8_NON_AL0 and CASP8_AL0. Referring to FIG. 2, the column command buffer 10 includes a delay section DLY, first to third inverters IV1-IV3, first and second PMOS transistors P1 and P2, and first and second NMOS transistors N1 and N2. The delay section DLY delays the column command CASP6 by a predetermined time. The first and second inverters IV1 and IV2 sequentially invert the output of the delay section DLY and generate the first internal column command CASP8_NON_AL0. The third inverter IV3 inverts the control signal AL0. When the control signal AL0 is enabled, the first PMOS transistor P1 and the first NMOS transistor N1 respectively receive the output of the third inverter IV3 and the control signal AL0 and thus are turned on. Since the second PMOS transistor P2 and the second NMOS transistor N2 operate as an inverter when the first PMOS transistor P1 and the first NMOS transistor N1 are turned on, the second PMOS transistor P2 and the second NMOS transistor N2 invert the output of the first inverter IV1 and generate the second internal column command CASP8_AL0.

The first internal column command CASP8_NON_AL0, which is generated in the column command buffer unit 10, is delayed by a clock cycle corresponding to the additive latency through the additive latency shifting unit 20 including the plurality of flip-flops as described above. The second internal column command CASP8_AL0 is provided as the internal read signal RD_int to the CAS write latency shifting unit 30 and is delayed by the CAS write latency shifting unit 30.

FIG. 3 is a circuit diagram illustrating one embodiment of a flop-flop in the additive latency shifting unit or the CAS write latency shifting unit shown in FIG. 1. Referring to FIG.

3, a flip-flop 21 includes a fourth inverter IV4, a fifth inverter IV5, a first pass gate PG1, a second pass gate PG2, a first latch section 21-1, and a second latch section 21-2. The first pass gate PG1 transmits the first internal column command CASP8_NON_AL0 (in the case of the flip-flop of the additive latency shifting unit 20) or the internal read signal RD_int (in the case of the flip-flop of the CAS write latency shifting unit) (since the second internal column command CASP8_AL0 is provided as the internal read signal RD_int without being delayed, the second internal column command CASP8_AL0 and the internal read signal RD_int are given together in FIG. 3) to a first node NA in response to a clock CLK and the clock inverted by the fourth inverter IV4. The first latch section 21-1 latches the level of the first node NA, and the second pass gate PG2 transmits the signal of the output node of the first latch section 21-1, that is, a second node NB, to a third node NC in response to the clock CLK and the clock inverted by the fifth inverter IV5. The second latch section 21-2 latches the level of the third node NC and generates an output signal OUT. Accordingly, the first pass gate PG1 outputs the first internal column command CASP8_NON_AL0 or the internal read signal RD_int when the clock CLK is at a high level, and the second pass gate PG2 outputs the signal of the second node NB when the clock CLK is at a low level.

FIG. 4 is a timing diagram illustrating operations of the flip-flop shown in FIG. 3 depending upon the frequency of a clock. Referring to FIG. 4, operations of the semiconductor memory apparatus with a clock of a high frequency and a clock of a low frequency are shown together. Due to the characteristics of clock signal, a clock of a high frequency has a steep slope, and a clock of a low frequency has a gentle slope. The delay section DLY of the column command buffer unit 10 delays the column command CASP6 such that the flip-flop of the additive latency shifting unit 20 or the flip-flop of the CAS write latency shifting unit 30 can precisely latch the first internal column command CASP8_NON_AL0 or the internal read signal RD_int or the second internal column command CASP8_AL0. However, in the case of a semiconductor memory apparatus operating with a clock of a low frequency, since the slope of the clock is very gradual, the flip-flop of the additive latency shifting unit 20 or the flip-flop of the CAS write latency shifting unit 30 may not precisely latch the first internal column command CASP8_NON_AL0 or the internal read signal RD_int.

Referring to FIG. 4, in the semiconductor memory apparatus operating with a clock of a high frequency, the flip-flop 21 normally latches and outputs the first internal column command CASP8_NON_AL0 or the internal read signal RD_int. However, in the semiconductor memory apparatus operating with a clock of a low frequency, falling of the clock CLK occurs after the first internal column command CASP8_NON_AL0 or the internal read signal RD_int falls to a low level, that is, the first internal column command CASP8_NON_AL0 or the internal read signal RD_int is at a low level at the first falling of the clock CLK. As a consequence, a period during which the first node NA has a high level is not sufficiently sustained, and, accordingly, the output signal OUT is not generated. In particular, such problem becomes serious when the second internal column command CASP8_AL0 is directly provided as the internal read signal RD_int according to the control signal AL0.

Thus, a method for generating an internal column command so as to generate the internal read signal or the internal write signal from a column command without error regardless of the changes of a clock's frequency is required.

SUMMARY

Accordingly, various exemplary embodiments of the invention may provide a column command buffer of a semiconductor memory apparatus, which can variably delay internal column commands according to the frequency of a clock inputted to the semiconductor memory apparatus, and a latency circuit including the same.

In one embodiment of the present invention, a column command buffer includes: a variable delay section configured to determine a delay time based on a frequency of a clock, delay a column command by the determined delay time, and output the delayed column command; and a buffering section configured to receive an output of the variable delay section and generate internal column commands.

In another embodiment of the present invention, a latency circuit of a semiconductor memory apparatus includes: a column command buffer unit configured to receive a column command, generate internal column commands, and determine enable timings of the internal column commands based on a frequency of a clock; and a latency unit configured to receive the internal column commands and generate an internal read signal and an internal write signal by delaying the internal column commands by preset times.

BRIEF DESCRIPTION OF THE DRAWINGS

Features, aspects, and embodiments are described in conjunction with the attached drawings, in which.

DETAILED DESCRIPTION

Figure 1:
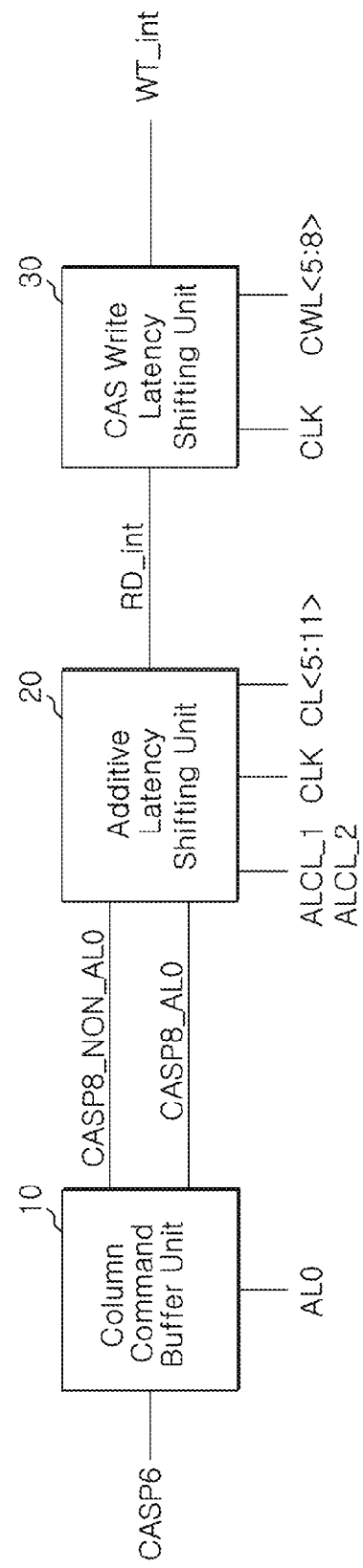
FIG. 1 is a block diagram schematically illustrating a configuration of a conventional latency circuit.
Figure 2:
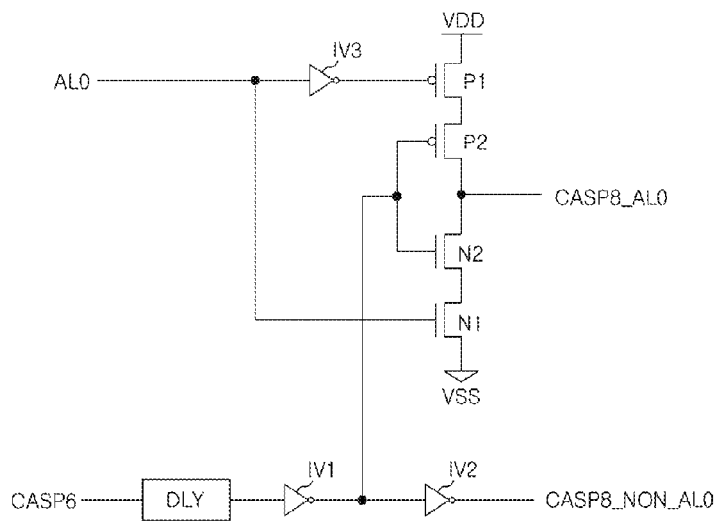
FIG. 2 is a circuit diagram illustrating a configuration of the column command buffer unit shown in FIG. 1.

Reference will now be made in detail to the exemplary embodiments consistent with the present disclosure, examples of which are illustrated in the accompanying drawings. Whenever possible, the same reference numerals will be used throughout the drawings to refer to the same or like parts.

Figure 5:
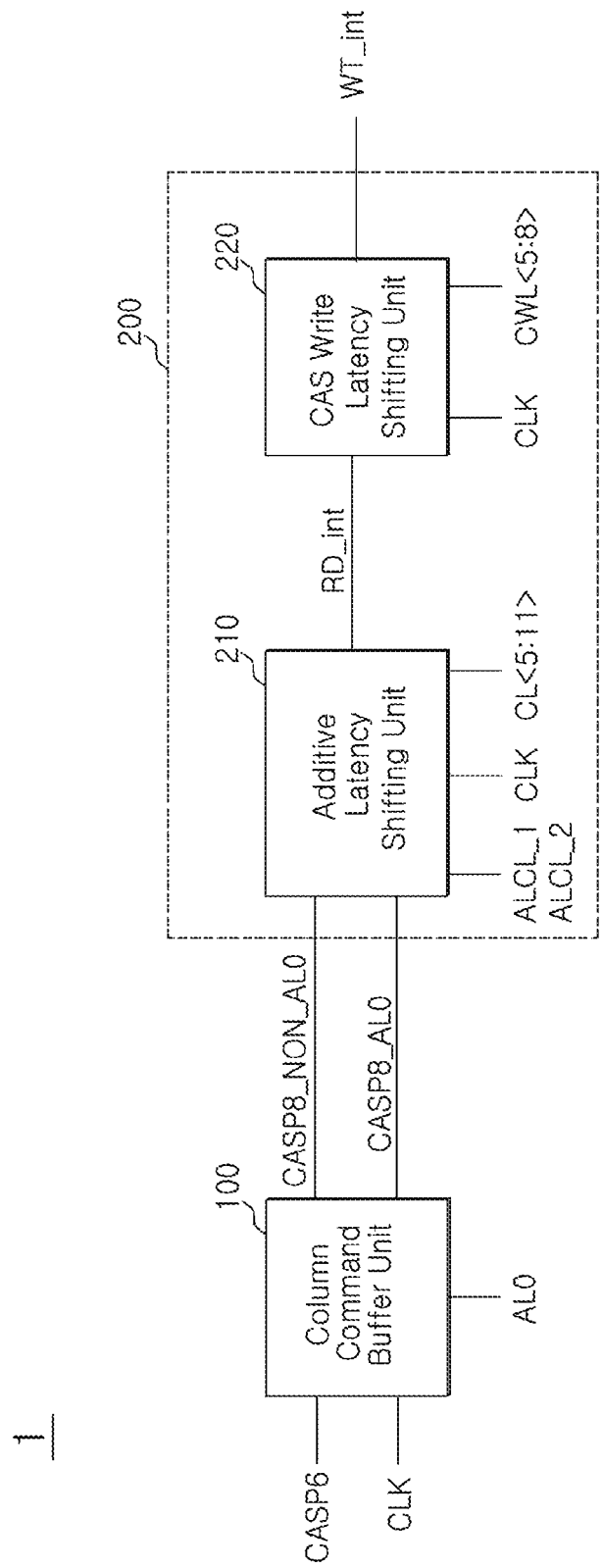
FIG. 5 is a block diagram schematically illustrating a configuration of a latency circuit in accordance with an embodiment of the present invention.

FIG. 5 is a block diagram schematically illustrating a configuration of a latency circuit in accordance with an embodiment of the present invention. Referring to FIG. 5, a latency circuit 1 may include a column command buffer unit 100 and a latency unit 200. The column command buffer unit 100 receives a column command CASP6 and generates internal column commands CASP8_NON_AL0 and CASP8_AL0. The column command buffer unit 100 determines the enable timings of the internal column commands CASP8_NON_AL0 and CASP8_AL0 based on the frequency of a clock CLK inputted to a semiconductor memory apparatus. That is to say, the column command buffer unit 100 determines a delay time depending upon whether the frequency of the clock CLK is high or low, and generates the internal column commands CASP8_NON_AL0 and CASP8_AL0 by delaying the column command CASP6 for the determined delay time.

When the frequency of the clock CLK is low, the enable timings of the internal column commands CASP8_NON_AL0 and CASP8_AL0 generated by the column command buffer unit 100 may be set to be later than those when the frequency of the clock CLK is a high frequency. Accordingly, when the frequency of the clock CLK is a low frequency, the column command buffer unit 100 may generate the internal column commands CASP8_NON_AL0 and CASP8_AL0 by delaying the column command CASP6 more than when the frequency of the clock CLK is a high frequency. The high frequency may be a frequency equal to or greater than a reference frequency, and the low frequency may be a frequency less than the reference frequency. The reference frequency can be controlled by a designer or a user according to an application.

The column command buffer unit 100 generates first and second internal column commands CASP8_NON_AL0 and CASP8_AL0 as the internal column commands. In detail, the column command buffer unit 100 receives the column command CASP6 and generates the first internal column command CASP8_NON_AL0, and generates the second internal column command CASP8_AL0 along with the first internal column command CASP8_NON_AL0 when a control signal AL0 is enabled. The control signal AL0 is a signal which is to be enabled when an additive latency is set to 0, and can be generated from an MRS (mode register set).

The latency unit 200 receives the first and second internal column commands CASP8_NON_AL0 and CASP8_AL0, and generates an internal read command RD_int or an internal write command WT_int by delaying the first and second internal column commands CASP8_NON_AL0 and CASP8_AL0 by preset delay times. The preset delay times can be determined by an additive latency AL, that is, control signals ALCL_1 and ALCL_2 and a CAS latency CL<5:11>, and a CAS write latency CWL. The additive latency AL and the CAS write latency CWL are provided by the MRS, and can be modified by the designer or the user according to the application.

Referring to FIG. 5, the latency unit 200 may include an additive latency shifting section 210 and a CAS write latency shifting section 220. The additive latency shifting section 210 is used when the semiconductor memory apparatus employs the additive latency AL. The additive latency shifting section 210 may include a plurality of flip-flops (not shown). When the control signal AL0 is disabled, the additive latency shifting section 210 delays the first internal column command CASP8_NON_AL0 by a clock cycle set based on the additive latency AL, and outputs the delayed command.

When the additive latency AL is 0, the additive latency shifting section 210 generates the second internal column command CASP8_AL0 as the internal read command RD_int immediately, and the CAS write latency shifting section 220 generates the internal write command WT_int by delaying the internal read command RD_int by a clock cycle corresponding to the CAS write latency CWL<5:8>.

When the additive latency AL is not 0, since the control signal AL0 is disabled, the second internal column command CASP8_AL0 is not generated. Accordingly, the additive latency shifting section 210 delays the first internal column command CASP8_NON_AL0 by a clock cycle corresponding to the additive latency (that is, the control signals ALCL_1 and ALCL_2 and the CAS latency CL<5:11>) and outputs the delayed command. The CAS write latency shifting section 220 generates the internal write command WT_int by delaying the output of the additive latency shifting section 210, that is, the internal read command, by a clock cycle set by the CAS write latency CWL.

The CAS write latency shifting section 220 may include a plurality of flip-flops (not shown). The CAS write latency shifting section 220 generates the internal write command WT_int by delaying the second internal column command CASP8_AL0 or a signal, generated by delaying the first internal column command CASP8_NON_AL0 by the clock cycle corresponding to the additive latency AL, that is, the internal read command RD_int, by the clock cycle corresponding to the CAS write latency CWL<5:8>.

The plurality of flip-flops (not shown) in additive latency shifting section 210 and the CAS write latency shifting section 220 are coupled in series, and are configured to receive the clock CLK through clock terminals and delay the internal column commands CASP8_NON_AL0 and CASP8_AL0 by one clock cycle sequentially. Accordingly, the latency unit 200 can provide a signal corresponding to the additive latency AL or the CAS write latency CWL<5:8> among the plurality of signals sequentially delayed by the plurality of flip-flops, as the internal read command RD_int or the internal write command WT_int. Since the configuration of the latency unit 200 is well known in the art and the flip-flops can be configured according to the conventional art, detailed descriptions thereof will be omitted herein.

Figure 6:
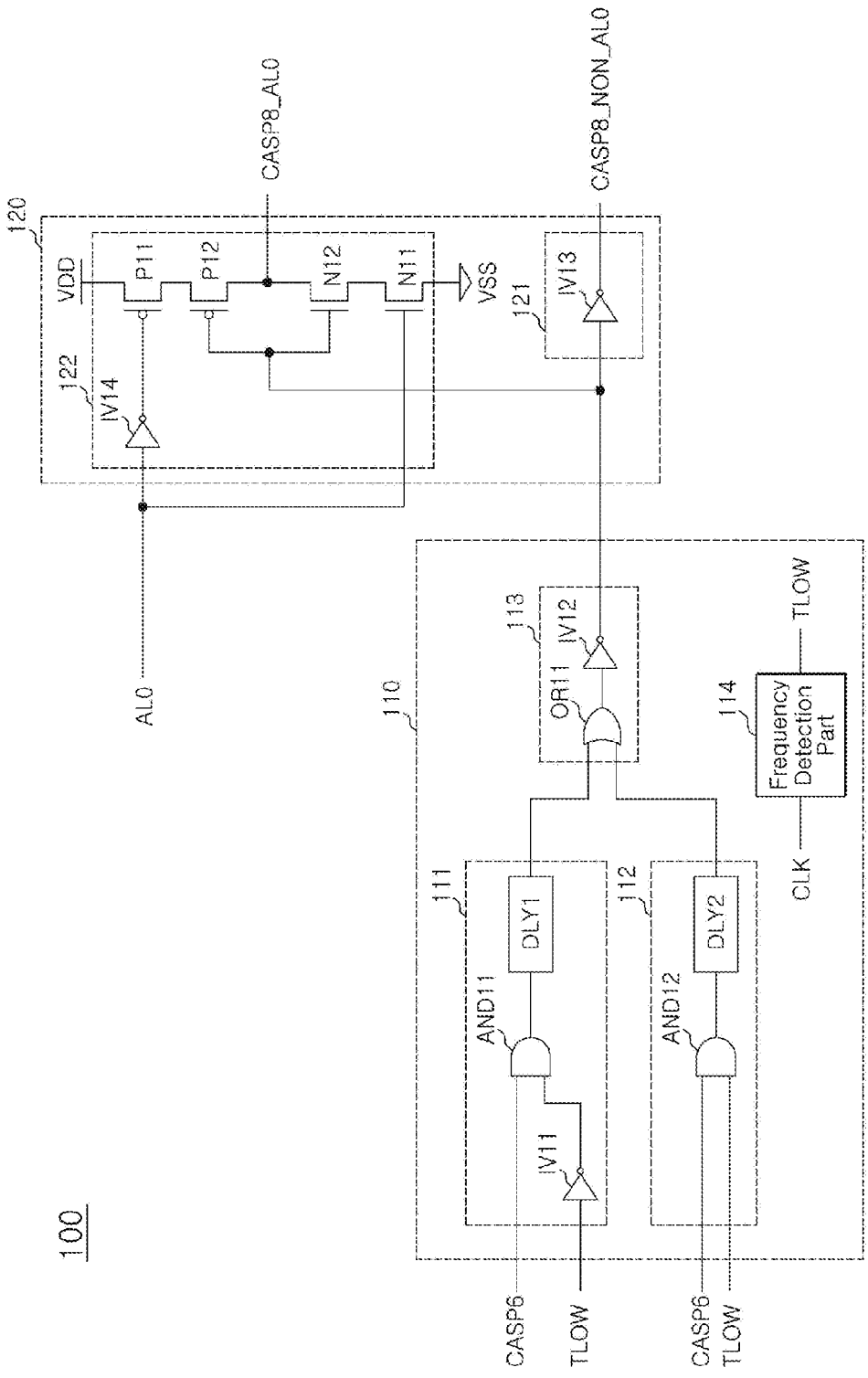
FIG. 6 is a circuit diagram illustrating a configuration of the column command buffer unit shown in FIG. 5 in accordance with an embodiment of the present invention.

FIG. 6 is a circuit diagram illustrating a configuration of the column command buffer unit 100 shown in FIG. 5 in accordance with an embodiment of the present invention. Referring to FIG. 6, the column command buffer unit 100 may include a variable delay section 110 and a buffering section 120. The variable delay section 110 determines the delay time of the column command CASP6 based on the frequency of the clock CLK. The variable delay section 110 generates the internal column commands CASP8_NON_AL0 and CASP8_AL0 by delaying the column command CASP6 for a first delay time when the frequency of the clock CLK is a high frequency. The variable delay section 110 generates the internal column commands CASP8_NON_AL0 and CASP8_AL0 by delaying the column command CASP6 for a second delay time when the frequency of the clock CLK is a low frequency. That is to say, the variable delay section 110 can vary the delay time of the column command CASP6 based on the frequency of the clock CLK, thus the variable delay section 110 can vary the enable timings of the internal column commands CASP8_NON_AL0 and CASP8_AL0 generated by the column command buffer unit 100.

Referring to FIG. 6, the variable delay section 110 may include a first delay part 111, a second delay part 112, and a selective output part 113. In the present embodiment, a detection signal TLOW is disabled when the clock CLK has a high frequency, and is enabled when the clock CLK has a low frequency. The detection signal TLOW can be generated from a test mode signal. Accordingly, when the frequency of the clock CLK is a high frequency, the disabled detection signal TLOW is generated from the test mode signal, and when the frequency of the clock CLK is a low frequency, the enabled detection signal TLOW is generated from the test mode signal. Also, the detection signal TLOW can be generated through a frequency detection part 114. The frequency detection part 114 receives the clock CLK and generates the detection signal TLOW depending upon whether the frequency of the clock CLK is a high frequency or a low frequency. A conventional frequency detection circuit can be used as the frequency detection part 114.

The first delay part 111 is configured to delay the column command CASP6 for the first delay time in response to the detection signal TLOW. The second delay part 112 is configured to delay the column command CASP6 for the second delay time in response to the detection signal TLOW. For example, the first delay part 111 delays the column command CASP6 by the first delay time when the detection signal TLOW is disabled, and the second delay part 112 delays the column command CASP6 by the second delay time when the detection signal TLOW is enabled. Accordingly, the delaying operations of the first and second delay parts 111 and 112 can be performed alternatively by the detection signal TLOW. The first delay time may be shorter than the second delay time. Furthermore, the first delay time may correspond to a delay time by which the conventional column command buffer unit (10 in FIG. 1) delays the column command CASP6. In other words, in the embodiment of the present invention, the internal column commands CASP8_NON_AL0 and CASP8_AL0 are generated in the same way as in the conventional art when the frequency of the clock CLK is a high frequency, thereby maintaining the performance of the semiconductor memory apparatus. Meanwhile, the internal column commands CASP8_NON_AL0 and CASP8_AL0 are generated later than in the conventional art when the frequency of the clock CLK is a low frequency, thereby preventing an improper operation caused in the conventional art and generating the internal read command RD_int and the internal write command WT_int without error.

The selective output part 113 is configured to output one of the outputs of the first and second delay parts 111 and 112.

Referring to FIG. 6, the first delay part 111 may include a first inverter IV11, a first AND gate AND11, and a first delay element DLY1. The first inverter IV11 inverts the detection signal TLOW. The first AND gate AND11 receives the column command CASP6 and the output of the first inverter IV11. The first delay element DLY1 delays the output of the first AND gate AND11 by the first delay time. Hence, the first delay part 111 can delay the column command CASP6 by the first delay time when the detection signal TLOW is disabled at a low level.

The second delay part 112 may include a second AND gate AND12 and a second delay element DLY2. The second AND gate AND12 receives the column command CASP6 and the detection signal TLOW. The second delay element DLY2 delays the output of the second AND gate AND12 by the second delay time. Hence, the second delay part 112 can delay the column command CASP6 by the second delay time when the detection signal TLOW is enabled at a high level.

The selective output part 113 may include a first OR gate OR11 and a second inverter IV12. The first OR gate OR11 receives the outputs of the first and second delay parts 111 and 112. The second inverter IV12 inverts the output of the first OR gate OR11 and outputs the inverted output. Hence, the selective output part 113 can invert one of the outputs of the first and second delay parts 111 and 112 and output the inverted output.

Referring to FIG. 6, the buffering section 120 receives the output of the variable delay section 110 and generates the first and second internal column commands CASP8_NON_AL0 and CASP8_AL0. The buffering section 120 receives the output of the variable delay section 110 and generates the first internal column command CASP8_NON_AL0. The buffering section 120 generates the second internal column command CASP8_AL0 along with the first internal column command CASP8_NON_AL0 when the control signal AL0 is enabled. The control signal AL0 is a signal for allowing the internal read command RD_int or the internal write command WT_int to be generated without using the additive latency AL, and can be generated from the MRS. Accordingly, the buffering section 120 can generate the second internal column command CASP8_AL0 only when the additive latency AL is not used.

Referring to FIG. 6, the buffering section 120 may include first and second buffering parts 121 and 122. The first buffering part 121 buffers the output of the variable delay section 110 and generates the first internal column command CASP8_NON_AL0. The second buffering part 122 is configured to be activated when the control signal AL0 is enabled. The second buffering part 122 buffers the output of the variable delay section 110, and generates the second internal column command CASP8_AL0. The first buffering part 121 may include a third inverter IV13 which inverts the output of the variable delay section 110 and generates the first internal column command CASP8_NON_AL0. The second buffering part 122 may include a fourth inverter IV14 and a tri-state inverter. The fourth inverter IV14 inverts the control signal AL0. The tri-state inverter includes first and second PMOS transistors P11 and P12 and first and second NMOS transistors N11 and N12. The tri-state inverter inverts the output of the variable delay section 110 when the control signal AL0 is enabled to a high level, and generates the second internal column command CASP8_AL0. That is to say, when the control signal AL0 is enabled to the high level, since the first PMOS transistor P11 and the first NMOS transistor N11 are turned on, the second PMOS transistor P12 and the second NMOS transistor N12 operate as an inverter.

Figure 3:
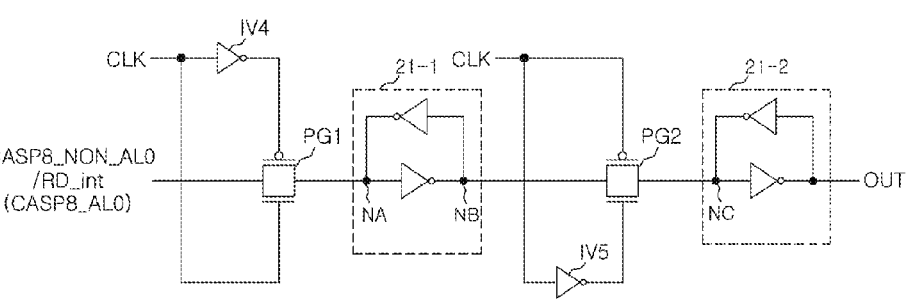
FIG. 3 is a circuit diagram illustrating a configuration of a flop-flop in the additive latency shifting unit or the CAS write latency shifting unit shown in FIG. 1.
Figure 4:
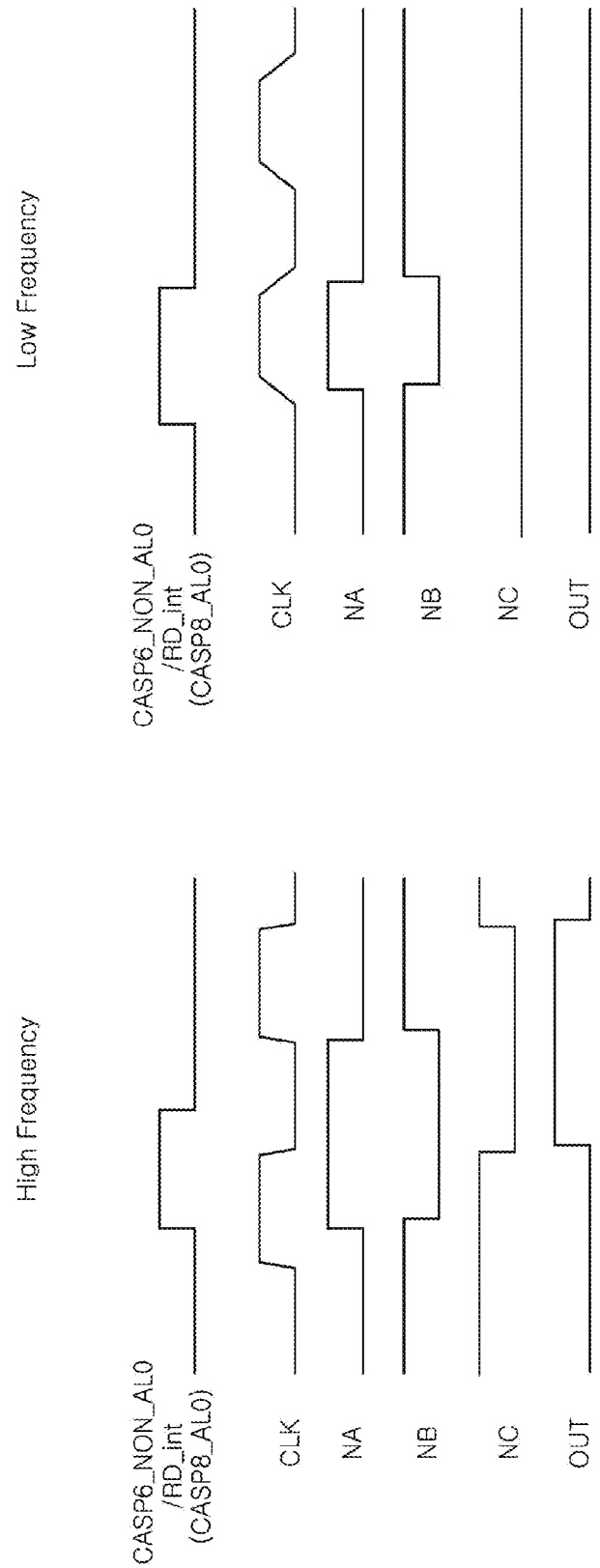
FIG. 4 is a timing diagram illustrating operations of the flip-flop shown in FIG. 3 when a clock has a high frequency and a low frequency.
Figure 7:
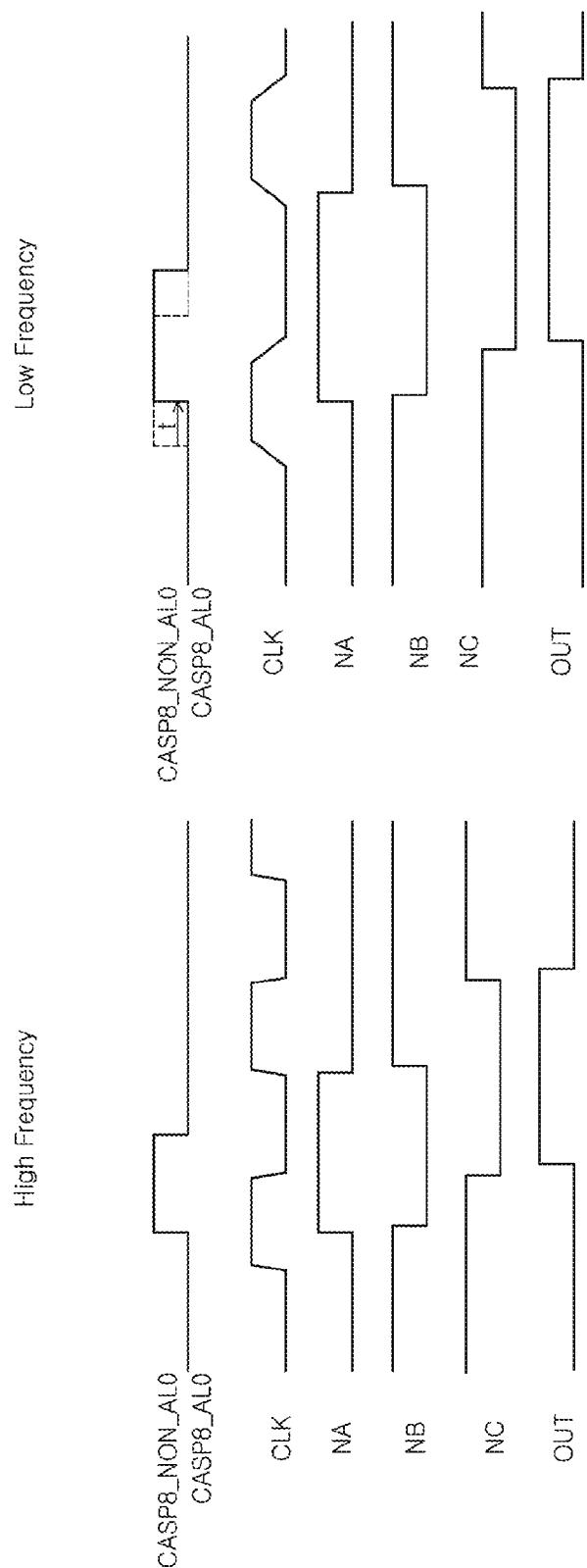
FIG. 7 is a timing diagram illustrating operations of the flip-flop shown in FIG. 3 when a clock has a high frequency and a low frequency, in accordance with the embodiment of the present invention.

FIG. 7 is a timing diagram illustrating an operation of the first flip-flop (see FIG. 3), which receives the first internal column command CASP8_NON_AL0, among the plurality of flip-flops in the additive latency shifting section 210 of the latency circuit 1, and the operation of the first flip-flop (see FIG. 3), which receives the second column command CASP8_AL0 or the internal read signal RD_int, among the plurality of flip-flops in the CAS write latency shifting unit 220 of the latency circuit 1. FIG. 7 illustrates the operations when the frequency of the clock CLK is a high frequency and a low frequency. The operations of the latency circuit 1 of a semiconductor memory apparatus in accordance with the embodiment of the present invention will be described with reference to FIGS. 5 to 7. When the frequency of the inputted clock CLK is a high frequency, the detection signal TLOW is disabled at a low level by the test mode signal or the frequency detection part 114. Accordingly, the variable delay section 110 delays the column command CASP6 by the first delay time through the first delay part 111, and the buffering section 120 generates the internal column commands CASP8_NON_AL0 and CASP8_AL0. The internal column commands CASP8_NON_AL0 and CASP8_AL0 are inputted to the flip-flops of the latency unit 200. Since the flip-flops normally latch the internal column commands CASP8_NON_AL0 and CASP8_AL0 in synchronization with the clock CLK and generate output signals OUT, the internal read command RD_int or the internal write command WT_int can be normally generated through the latency unit 200.

When the frequency of the inputted clock CLK is a low frequency, the detection signal TLOW is enabled by the test mode signal or the frequency detection part 114. Accordingly, the variable delay section 110 delays the column command CASP6 by the second delay time through the second delay part 112, and the buffering section 120 generates the internal column commands CASP8_NON_AL0 and CASP8_AL0 by buffering the output of the variable delay section 110. In the conventional art, when the frequency of the clock CLK is a low frequency, a misoperation that the internal read command RD_int or the internal write command WT_int is not generated is occurred since the flip-flop does not properly latch the internal column commands CASP8_NON_AL0 and CASP8_AL0. In the present invention, because the variable delay section 110 delays the column command CASP6 by the second delay time when the frequency of the clock CLK is a low frequency, the internal column commands CASP8_NON_AL0 and CASP8_AL0 are enabled later by t (the second delay time−the first delay time) than when the frequency of the clock CLK is a high frequency. Therefore, since the internal column commands CASP8_NON_AL0 and CASP8_AL0 is sufficiently latched, the output signal OUT can be generated properly even when the clock CLK is a low frequency. Accordingly, the latency unit 200 can generate the internal read command RD_int or the internal write command WT_int without error.

While certain embodiments have been described above with reference to illustrative examples for particular applications, it will be understood to those skilled in the art that the embodiments described are by way of example only. Those skilled in the art with access to the teachings provided in this disclosure will recognize additional modifications, applications, and/or embodiments and additional fields in which the present disclosure would be of significant utility. Accordingly, the column command buffer of a semiconductor memory apparatus and the latency circuit including the same described herein should not be limited based on the described embodiments. Rather, the column command buffer of a semiconductor memory apparatus and the latency circuit including the same described herein should only be limited in light of the claims that follow when taken in conjunction with the above description and accompanying drawings.

What is claimed is:

1. A column command buffer comprising:
   a variable delay section configured to determine a delay time based on a frequency of a clock, delay a column command by the determined delay time, and output the delayed column command; and
   a buffering section configured to receive an output of the variable delay section and generate internal column commands,
   wherein the variable delay section is configured to delay the column command by a first delay time when the frequency of the clock is higher than a reference frequency, and delay the column command by a second delay time when the frequency of the clock is lower than the reference frequency.

2. The column command buffer according to claim 1, wherein the second delay time is longer than the first delay time.

3. The column command buffer according to claim 2, wherein the variable delay section comprises:
   a first delay part configured to delay the column command by the first delay time in response to a detection signal;
   a second delay part configured to delay the column command by the second delay time in response to the detection signal; and
   a selective output part configured to output one of outputs of the first and second delay parts.

4. The column command buffer according to claim 3, wherein the detections signal is generated from a test mode signal.

5. The column command buffer according to claim 3, wherein the detection signal is generated by a frequency detection part configured to detect the frequency of the clock.

6. The column command buffer according to claim 1, wherein the internal column commands include first and second internal column commands, and
wherein the buffering section comprises:
   a first buffering part configured to receive an output of the variable delay section and generate the first internal column command; and
   a second buffering part configured to receive an output of the variable delay section and generate the second internal column command when a control signal is enabled.

7. A latency circuit of a semiconductor memory apparatus, comprising:
   a column command buffer unit configured to receive a column command, generate internal column commands, and determine enable timings of the internal column commands based on a frequency of a clock; and
   a latency unit configured to receive the internal column commands and generate an internal read signal and an internal write signal by delaying the internal column commands by preset times,
   wherein the enable timings of the internal column commands when the frequency of the clock is a low frequency are later than the enable timings of the internal column commands when the frequency of the clock is a high frequency higher than the low frequency.

8. The latency circuit according to claim 7,
   wherein the internal column commands include first and second internal column commands, and
   wherein the column command buffer unit comprises:
   a variable delay section configured to determine a delay time based on the frequency of the clock, and delay the column command by the determined delay time, and output the delayed column command; and
   a buffering section configured to receive an output of the variable delay section and generate the first and second internal column commands in response to a control signal.

9. The latency circuit according to claim 8, wherein the variable delay section delays the column command by a first delay time when the frequency of the clock is higher than a reference frequency, and delays the column command by a second delay time when the frequency of the clock is lower than the reference frequency.

10. The latency circuit according to claim 9, wherein the second delay time is longer than the first delay time.

11. The latency circuit according to claim 10, wherein the variable delay section comprises:
   a first delay part configured to delay the column command by the first delay time in response to a detection signal; and
   a second delay part configured to delay the column command by the second delay time in response to the detection signal.

12. The latency circuit according to claim 11, wherein the detection signal is generated from a test mode signal.

13. The latency circuit according to claim 11, wherein the detection signal is generated by a frequency detection part configured to detect the frequency of the clock.

14. The latency circuit according to claim 8,
   wherein the buffering section receives the output of the variable delay section and generates the first internal column command, and
   wherein the buffering section generates the second internal column command when the control signal is enabled.

15. The latency circuit according to claim 14, wherein the buffering section comprises:

a first buffering part configured to buffer the output of the variable delay section and generate the first internal column command; and a second buffering part configured to buffer the output of the variable delay section and generate the second internal column command when the control signal is enabled.

16. The latency circuit according to claim 7, wherein the preset times are determined by an additive latency and a CAS write latency.

17. The latency circuit according to claim 16, wherein the latency unit comprises:

an additive latency shifting section configured to delay the first internal column command by a clock cycle set by the additive latency and output the delayed first internal column command as an internal read signal, or output the second internal column command as the internal read signal; and a CAS write latency shifting section configured to output an internal write signal by delaying the internal read signal by a clock cycle set by the CAS write latency.

* * * * *